(12) United States Patent
Ariyoshi et al.

(10) Patent No.: US 9,978,842 B2
(45) Date of Patent: May 22, 2018

(54) SEMICONDUCTOR DEVICE AND METHOD FOR MANUFACTURING THE SAME

(71) Applicants: Kabushiki Kaisha Toshiba, Minato-ku (JP); National Institute of Advanced Industrial Science and Technology, Chiyoda-ku (JP); Fuji Electric Co., Ltd., Kawasaki-shi (JP)

(72) Inventors: Keiko Ariyoshi, Okayama (JP); Tatsuo Shimizu, Shinagawa (JP); Takashi Shinohe, Yokosuka (JP); Junji Senzaki, Tsukuba (JP); Shinsuke Harada, Tsukuba (JP); Takahito Kojima, Kawasaki (JP)

(73) Assignees: Kabushiki Kaisha Toshiba, Minato-ku (JP); National Institute of Advanced Industrial Science and Technology, Chiyoda-ku (JP); FUJI ELECTRIC CO., LTD., Kawasaki-shi (JP)

( * ) Notice: Subject to any disclaimer, the term of this patent is extended or adjusted under 35 U.S.C. 154(b) by 24 days.

(21) Appl. No.: 15/071,398

(22) Filed: Mar. 16, 2016

(65) Prior Publication Data

US 2016/0197150 A1 Jul. 7, 2016

Related U.S. Application Data

(63) Continuation of application No. PCT/JP2014/074451, filed on Sep. 16, 2014.

(30) Foreign Application Priority Data

Sep. 18, 2013 (JP) .................................. 2013-192824

(51) Int. Cl.
H01L 29/16 (2006.01)
H01L 29/04 (2006.01)
(Continued)

(52) U.S. Cl.
CPC ...... *H01L 29/1608* (2013.01); *H01L 21/0214* (2013.01); *H01L 21/0223* (2013.01);
(Continued)

(58) Field of Classification Search
CPC .. H01L 29/1608; H01L 29/513; H01L 29/518
See application file for complete search history.

(56) References Cited

U.S. PATENT DOCUMENTS

| | | | |
|---|---|---|---|
| 8,525,187 B2 * | 9/2013 | Harada | ................. H01L 29/045 257/173 |
| 2005/0077569 A1 * | 4/2005 | Yamashita | .......... H01L 29/7828 257/330 |

(Continued)

FOREIGN PATENT DOCUMENTS

| | | |
|---|---|---|
| JP | 2005-166930 | 6/2005 |
| JP | 2006-210818 A | 8/2006 |

(Continued)

OTHER PUBLICATIONS

International Search Report dated Dec. 22, 2014 in PCT/JP2014/074451, filed Sep. 16, 2014 (with English Translation).

(Continued)

*Primary Examiner* — Matthew Reames
*Assistant Examiner* — John Bodnar
(74) *Attorney, Agent, or Firm* — Oblon, McClelland, Maier & Neustadt, L.L.P.

(57) ABSTRACT

According to one embodiment, a semiconductor device includes a first semiconductor region, a second semiconductor region, a third semiconductor region, a first electrode, a second electrode, a control electrode and an insulating film. The first semiconductor region is of a first conductivity type and includes SiC. The second semiconductor region is provided on the first semiconductor region and has a first surface. The second semiconductor region is of a second (Continued)

conductivity type and includes SiC. The third semiconductor region is provided on the second semiconductor region, is of the first conductivity type and includes SiC. The first and second electrodes are electrically connected to the third semiconductor region. The control electrode is provided on the second semiconductor region. The insulating film is provided between the second semiconductor region and the control electrode. The insulating film contacts the first surface and the control electrode and includes nitrogen.

10 Claims, 8 Drawing Sheets

(51) Int. Cl.
  *H01L 21/02* (2006.01)
  *H01L 29/66* (2006.01)
  *H01L 29/78* (2006.01)
  *H01L 29/51* (2006.01)
  *H01L 21/04* (2006.01)

(52) U.S. Cl.
  CPC .. *H01L 21/02247* (2013.01); *H01L 21/02326* (2013.01); *H01L 21/02332* (2013.01); *H01L 21/02337* (2013.01); *H01L 21/02529* (2013.01); *H01L 21/049* (2013.01); *H01L 29/045* (2013.01); *H01L 29/513* (2013.01); *H01L 29/518* (2013.01); *H01L 29/66068* (2013.01); *H01L 29/7802* (2013.01); *H01L 29/7813* (2013.01); *H01L 21/02255* (2013.01)

(56) References Cited

U.S. PATENT DOCUMENTS

| | | |
|---|---|---|
| 2008/0265337 A1 | 10/2008 | Minakata |
| 2011/0180813 A1 | 7/2011 | Harada et al. |
| 2012/0009801 A1 | 1/2012 | Tanioka et al. |
| 2012/0286291 A1 | 11/2012 | Hiyoshi et al. |

FOREIGN PATENT DOCUMENTS

| | | |
|---|---|---|
| JP | 2010-27962 A | 2/2010 |
| JP | 2011-82454 A | 4/2011 |
| JP | 2011-165941 A | 8/2011 |
| WO | WO 2007/086111 A1 | 8/2007 |
| WO | WO 2010/103820 A1 | 9/2010 |
| WO | WO 2010/116886 A1 | 10/2010 |
| WO | WO 2011/111627 A1 | 9/2011 |
| WO | WO 2012/018975 A2 | 2/2012 |

OTHER PUBLICATIONS

Written Opinion dated Dec. 22, 2014 in PCT/JP2014/074451, filed Sep. 16, 2014.

* cited by examiner

SEMICONDUCTOR DEVICE AND METHOD FOR MANUFACTURING THE SAME

CROSS-REFERENCE TO RELATED APPLICATIONS

This is a continuation application of International Application PCT/JP2014/074451, filed on Sep. 16, 2014; the entire contents of which are incorporated herein by reference.

FIELD

Embodiments described herein relate generally to a semiconductor device and a method for manufacturing the same.

BACKGROUND

Compared to silicon (Si), silicon carbide (SiC) has excellent properties such as 3 times the bandgap, about 10 times the breakdown electric field strength, and about 3 times the thermal conductivity. A device having low loss and high field effect mobility (channel mobility) is realized by the application of SiC in a semiconductor device such as a MOSFET (Metal Oxide Semiconductor Field Effect Transistor), etc. It is desirable to further improve the field effect mobility of the semiconductor device.

DETAILED DESCRIPTION

According to one embodiment, a semiconductor device includes a first semiconductor region, a second semiconductor region, a third semiconductor region, a first electrode, a second electrode, a control electrode and an insulating film. The first semiconductor region is of a first conductivity type. The first semiconductor region includes SiC. The second semiconductor region is provided on the first semiconductor region and has a first surface. The second semiconductor region is of a second conductivity type. The second semiconductor region includes SiC. The third semiconductor region is provided on the second semiconductor region. The third semiconductor region is of the first conductivity type. The third semiconductor region includes SiC. The first electrode is electrically connected to the first semiconductor region. The second electrode is electrically connected to the third semiconductor region. The control electrode is provided on the second semiconductor region. The insulating film is provided between the second semiconductor region and the control electrode. The insulating film contacts the first surface and the control electrode and includes nitrogen. The insulating film includes a first position and a second position along a first direction. The first direction is from the second semiconductor region toward the control electrode. The first position is disposed between the second position and the first surface in the first direction. A concentration of the nitrogen in the insulating film has a peak at the first position. A distance between the first position and the first surface is not less than 2 nanometers but less than 10 nanometers. A concentration of the nitrogen at the second position is ½ of the concentration of the nitrogen at the first position. A distance along the first direction between the first position and the second position is not less than 10 nanometers but less than 20 nanometers.

Embodiments of the invention will now be described based on the drawings. In the description hereinbelow, the same members are marked with the same reference numerals; and a description is omitted as appropriate for members once described.

In the following description, the notations of $n^+$, n, $n^-$, $p^+$, p, and $p^-$ indicate relative levels of the impurity concentrations of the conductivity types. In other words, the n-type impurity concentration is relatively higher for $n^+$ than for n; and the n-type impurity concentration is relatively lower for $n^-$ than for n. The p-type impurity concentration is relatively higher for $p^+$ than for p; and the p-type impurity concentration is relatively lower for $p^-$ than for p.

As a specific example in the description hereinbelow, a first conductivity type is the n-type; and a second conductivity type is the p-type.

First Embodiment

Figure 1:
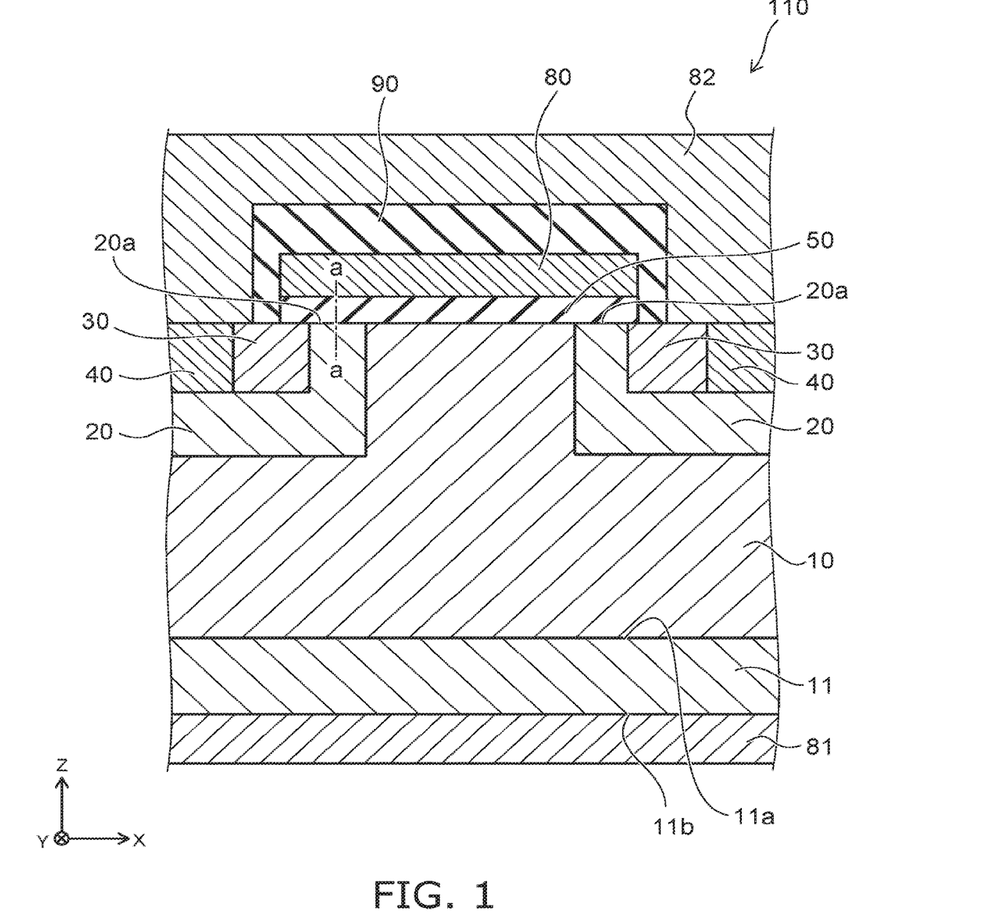
FIG. 1 is a schematic cross-sectional view illustrating the configuration of a semiconductor device according to a first embodiment.

FIG. 1 is a schematic cross-sectional view illustrating the configuration of the semiconductor device according to the first embodiment.

As shown in FIG. 1, the semiconductor device 110 according to the embodiment includes a first semiconductor region 10, a second semiconductor region 20, a third semiconductor region 30, a first electrode 81, a second electrode 82, a control electrode 80, and an insulating film 50.

In the semiconductor device 110, the first semiconductor region 10, the second semiconductor region 20, and the third semiconductor region 30 include SiC. The semiconductor device 110 is, for example, a MOSFET that includes SiC.

The conductivity type of the first semiconductor region is a first conductivity type. In the embodiment, the conductivity type of the first semiconductor region 10 is the $n^-$-type. The first semiconductor region 10 may be provided on a substrate 11. The conductivity type of the substrate 11 is the first conductivity type. In the embodiment, the substrate 11 is a SiC substrate of the $n^+$-type. In the embodiment, the direction connecting the substrate 11 and the first semiconductor region 10 is taken as a Z-direction; one direction orthogonal to the Z-direction is taken as an X-direction; and a direction orthogonal to the Z-direction and the X-direction is taken as a Y-direction.

The substrate 11 includes, for example, hexagonal crystalline 4H—SiC. The substrate 11 has a first major surface 11a. The first major surface 11a is, for example, the (000-1) plane of 4H—SiC. The first major surface 11a may be the (0001) plane of 4H—SiC. The impurity that is included in the substrate 11 is, for example, at least one of phosphorus (P) or nitrogen (N). The impurity concentration of the substrate 11 is, for example, not less than about $5\times10^{18}$ cm$^{-3}$ and not more than about $1\times10^{19}$ cm$^{-3}$.

The first semiconductor region 10 is formed on the first major surface 11a of the substrate 11. The first semiconductor region 10 is a breakdown voltage sustaining layer of the MOSFET. The impurity that is included in the first semiconductor region 10 is, for example, N. The impurity concentration of the first semiconductor region 10 is, for example, not less than about $5\times10^{15}$ cm$^{-3}$ and not more than about $2\times10^{16}$ cm$^{-3}$. The thickness (the thickness in the Z-direction) of the first semiconductor region 10 is, for example, not less than about 5 micrometers (µm) and not more than about 10 µm.

The second semiconductor region 20 is provided on the first semiconductor region 10. In the embodiment, the second semiconductor region 20 is provided on a portion of the first semiconductor region 10. The second semiconductor region 20 is the base region of the MOSFET. The second semiconductor region 20 has a first surface 20a.

The conductivity type of the second semiconductor region 20 is a second conductivity type. In the embodiment, the conductivity type of the second semiconductor region 20 is the p-type. The impurity that is included in the second semiconductor region 20 is, for example, aluminum (Al). The impurity concentration of the second semiconductor region 20 is, for example, not less than about $1\times10^{16}$ cm$^{-3}$ and not more than about $5\times10^{17}$ cm$^{-3}$. In a normally-off MOSFET, it is desirable for the impurity concentration of the second semiconductor region 20 to be, for example, not less than about $5\times10^{17}$ cm$^{-3}$ and not more than about $1\times10^{19}$ cm$^{-3}$. The thickness of the second semiconductor region 20 is, for example, about 0.6 µm.

The third semiconductor region 30 is provided on the second semiconductor region 20. In the embodiment, the third semiconductor region 30 is provided on a portion of the second semiconductor region 20. The third semiconductor region 30 is, for example, the source region of the MOSFET. In the semiconductor device 110, for example, the second semiconductor region 20 is provided between the first semiconductor region 10 and the third semiconductor region 30 in the X-direction.

The conductivity type of the third semiconductor region 30 is the first conductivity type. In the embodiment, the conductivity type of the third semiconductor region 30 is the n$^+$-type. The impurity that is included in the third semiconductor region 30 is, for example, N. The impurity concentration of the third semiconductor region 30 is higher than the impurity concentration of the first semiconductor region 10. The impurity concentration of the third semiconductor region 30 is, for example, about $1\times10^{20}$ cm$^{-3}$. The thickness of the third semiconductor region 30 is thinner than the thickness of the second semiconductor region 20. The thickness of the third semiconductor region 30 is, for example, about 0.3 µm.

The first semiconductor region 10, the second semiconductor region 20, and the third semiconductor region 30 are arranged along the first surface 20a in the semiconductor device 110.

In the semiconductor device 110, a fourth semiconductor region 40 that is adjacent to the third semiconductor region 30 may be provided. The fourth semiconductor region 40 is a contact region of the MOSFET. The conductivity type of the fourth semiconductor region 40 is the second conductivity type. In the embodiment, the conductivity type of the fourth semiconductor region 40 is the p$^+$-type. The impurity that is included in the fourth semiconductor region 40 is, for example, Al. The impurity concentration of the fourth semiconductor region 40 is, for example, not less than about $1\times10^{19}$ cm$^{-3}$ and not more than about $1\times10^{20}$ cm$^{-3}$. The thickness of the fourth semiconductor region 40 is thinner than the thickness of the second semiconductor region 20. The thickness of the fourth semiconductor region 40 is, for example, about 0.3 µm.

The first electrode 81 is electrically connected to the first semiconductor region 10. The first electrode 81 is, for example, a drain electrode of the MOSFET. For example, the first electrode 81 contacts a second major surface 11b of the substrate 11. The first electrode 81 has an ohmic contact with the substrate 11.

The second electrode 82 is electrically connected to the third semiconductor region 30. The second electrode 82 is, for example, a source electrode of the MOSFET. The second electrode 82 contacts the third semiconductor region 30. In the case where the fourth semiconductor region 40 is provided, the second electrode 82 contacts both the third semiconductor region 30 and the fourth semiconductor region 40. In such a case, the second electrode 82 is a common electrode of the MOSFET.

The control electrode 80 is provided on the second semiconductor region 20. The control electrode 80 is a gate electrode of the MOSFET. In the embodiment, the control electrode 80 is provided on the first semiconductor region 10, the second semiconductor region 20, and the third semiconductor region 30 arranged in the X-direction. An inter-layer insulating film 90 is provided between the control electrode 80 and the second electrode 82.

The insulating film 50 is provided between the second semiconductor region 20 and the control electrode 80. The insulating film 50 contacts the first surface 20a and the control electrode 80. The insulating film 50 is a gate insulator film of the MOSFET. In the embodiment, the insulating film 50 is provided on the first semiconductor region 10, the second semiconductor region 20, and the third semiconductor region 30 arranged in the X-direction.

It is desirable for the thickness (the thickness in the Z-direction) of the insulating film 50 to be, for example, not less than about 30 nm and not more than about 100 nm. In the case where the thickness of the insulating film 50 is less than 30 nm, there is a possibility that the initial breakdown voltage and reliability as a gate insulator film may decrease. In the case where the thickness of the insulating film 50 exceeds 100 nm, there is a possibility that the driving ability of the MOSFET may decrease.

The insulating film 50 includes N. In the embodiment, the major components of the insulating film 50 are Si, oxygen (O), and N. The position of the peak of the concentration distribution of N included in the insulating film 50 (the concentration distribution along line a-a parallel to the Z-direction shown in FIG. 1) is separated from the first surface 20a by not less than 2 nm but less than 10 nm in the Z-direction. The width at half maximum of the peak of the concentration distribution of N included in the insulating film 50 is not less than 10 nm but less than 20 nm.

The insulating film 50 includes a first position p1 and a second position p2 along a first direction (the Z-direction) from the second semiconductor region 20 toward the control electrode 80. The first position p1 is disposed between the second position p2 and the first surface 20a in the first direction. The concentration of the nitrogen in the insulating film 50 has a peak at the first position p1. The distance between the first position p1 and the first surface 20a is not less than 2 nanometers but less than 10 nanometers. The concentration of the nitrogen at the second position p2 is ½ of the concentration of the nitrogen at the first position. The distance along the first direction between the first position p1 and the second position p2 is not less than 5 nanometers but less than 10 nanometers.

Operations of the semiconductor device 110 will now be described.

When a voltage that is not less than the threshold is applied to the control electrode 80 in a state in which a voltage that is positive with respect to the second electrode 82 is applied to the first electrode 81, an inversion layer (a channel) is formed in the second semiconductor region 20 at the vicinity of the interface with the insulating film 50. Thereby, the semiconductor device 110 is switched to the ON state; and a current flows from the first electrode 81 toward the second electrode 82.

On the other hand, when the voltage that is applied to the control electrode 80 is less than the threshold, the channel disappears. Thereby, the semiconductor device 110 is switched to the OFF state; and the current flowing from the first electrode 81 to the second electrode 82 is interrupted.

The field effect mobility is improved by the semiconductor device 110 including the insulating film 50 including a concentration distribution of N such as that recited above.

The concentration distribution of N included in the insulating film 50 will now be described.

Figure 2:
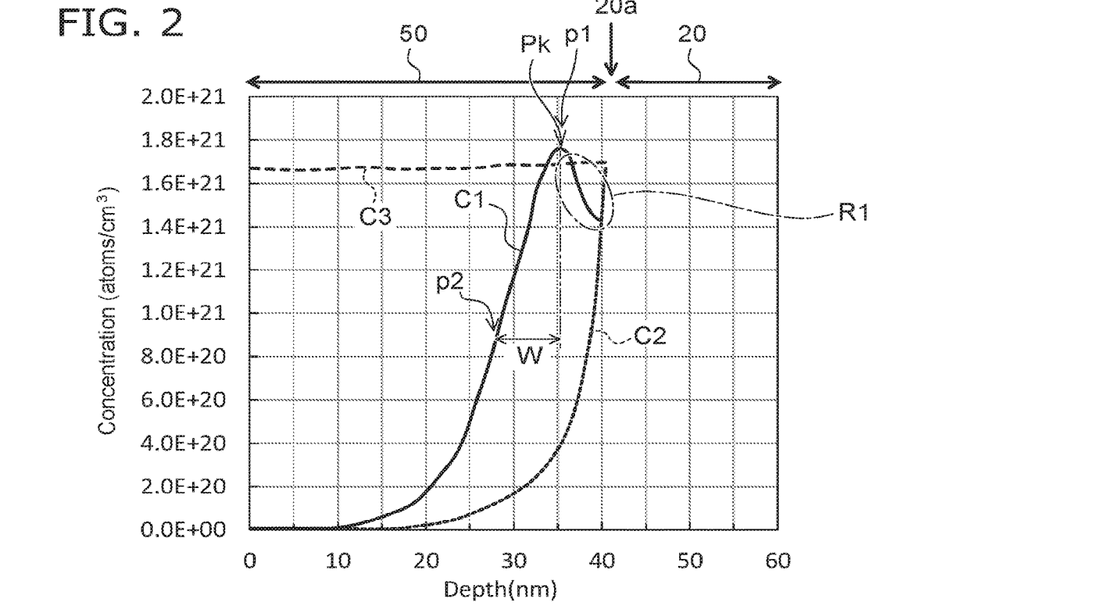
FIG. 2 illustrates the concentration distribution of N in the insulating film.

FIG. 2 illustrates the concentration distribution of N in the insulating film.

FIG. 2 shows concentration distributions C1, C2, and C3. The concentration distribution C1 is the concentration distribution of N in the insulating film 50 of the semiconductor device 110 according to the embodiment. The concentration distribution C2 is the concentration distribution of N in an insulating film 501 of a semiconductor device according to a first reference example. The concentration distribution C3 is the concentration distribution of N in an insulating film 502 of a semiconductor device according to a second reference example.

In FIG. 2, the horizontal axis is the depth (nm) having the surfaces of the insulating films 50, 501, and 502 as references; and the vertical axis is the concentration of N ($cm^{-3}$).

FIG. 2 shows an example of the analysis results of the concentration of N using SIMS (Secondary Ion Mass Spectrometry). In the example shown in FIG. 2, the thicknesses of the insulating films 50, 501, and 502 are about 40 nm. Accordingly, the interface (the first surface 20a) between the second semiconductor region 20 and the insulating films 50, 501, and 502 is at a depth of about 40 nm from the surfaces of the insulating films 50, 501, and 502.

As illustrated by the concentration distribution C1 of FIG. 2, the concentration of N included in the insulating film 50 of the semiconductor device 110 according to the embodiment increases gradually in the depth direction from the surface of the insulating film 50. The concentration of N reaches a peak Pk at the vicinity of the interface (the first surface 20a) between the insulating film 50 and the second semiconductor region 20. The concentration of N decreases gradually from the position of the peak Pk to the interface (the first surface 20a).

In the concentration distribution C1, the position of the peak Pk of the concentration of N is about 8 nm from the interface (the first surface 20a). The width at half maximum of the peak of the concentration of N is about 15 nm. The width at half maximum is the width of the distribution at ½ of the concentration of the peak Pk of the concentration of N. Only half (arrow W) of the distribution showing the width at half maximum is shown in the example shown in FIG. 2.

As illustrated by the concentration distribution C2, the concentration of N included in the insulating film 501 of the semiconductor device according to the first reference example increases gradually in the depth direction from the surface of the insulating film 501. In the concentration distribution C2, the concentration of N reaches a peak at the interface (the first surface 20a) between the insulating film 501 and the second semiconductor region 20.

As illustrated by the concentration distribution C3, the concentration distribution of N included in the insulating film 502 of the semiconductor device according to the second reference example is substantially constant from the surface of the insulating film 502 to the interface (the first surface 20a) between the insulating film 502 and the second semiconductor region 20.

The inventors of the application discovered a new problem in which the concentration distribution of N of the insulating film 50 affects the field effect mobility. In other words, it was confirmed that compared to the semiconductor devices according to the first reference example and the second reference example, the field effect mobility is improved by such a concentration distribution of N of the insulating film 50 in the semiconductor device 110.

First, one study performed by the inventors of the application for the interface states when the insulating films 50, 501, and 502 are used will be described.

Figure 3:
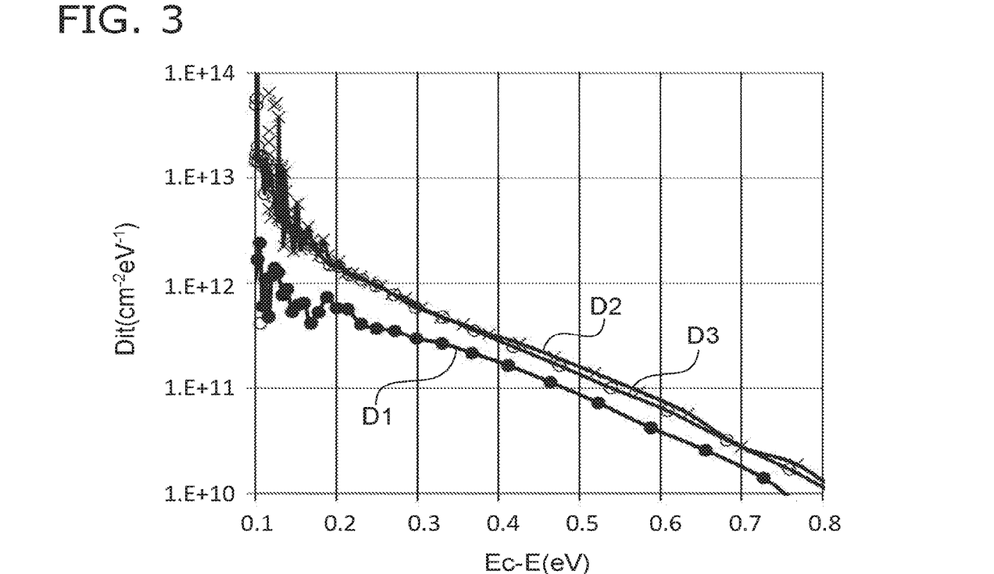
FIG. 3 illustrates interface states.

FIG. 3 illustrates interface states.

FIG. 3 shows the interface states D1, D2, and D3. The interface state D1 shows the results of verifying the interface state for a MOS capacitor made of the insulating film 50 included in the embodiment. The interface state D2 shows the results of verifying the interface state for a MOS capacitor made of the insulating film 501 included in the first reference example. The interface state D3 shows the results of verifying the interface state for a MOS capacitor made of the insulating film 502 included in the second reference example.

In FIG. 3, the horizontal axis is the energy level (eV); and the vertical axis is the interface state density ($cm^{-2}$ $eV^{-1}$). As shown in FIG. 3, it can be seen that the interface state D1 decreases more than the interface states D2 and D3. Such a difference between the interface states D1, D2, and D3 affects the field effect mobility.

Figure 4:
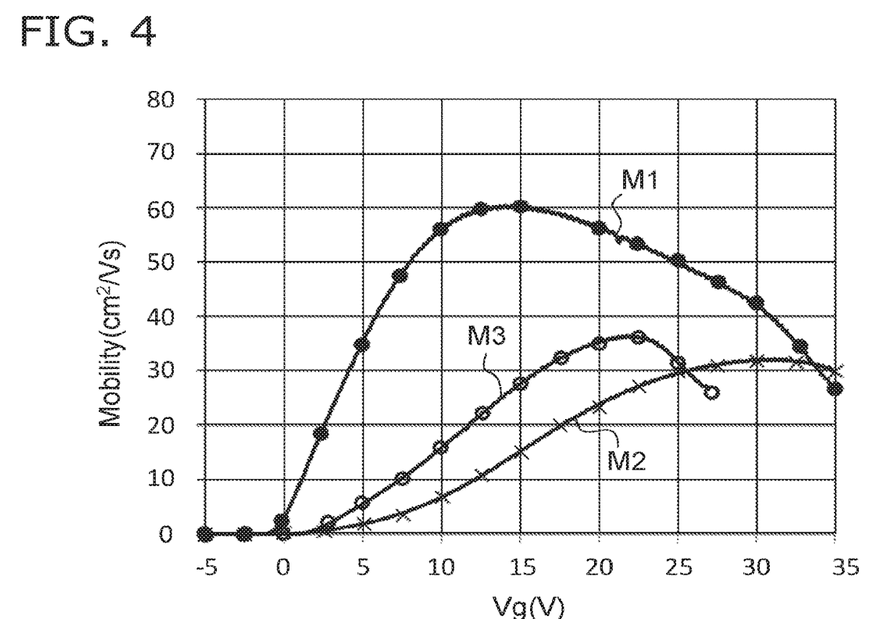
FIG. 4 illustrates field effect mobility.

Another study performed by the inventors of the application for the field effect mobility will now be described. FIG. 4 illustrates field effect mobilities.

FIG. 4 shows the field effect mobilities M1, M2, and M3. The field effect mobility M1 shows the results when making a MOSFET of the insulating film 50 included in the embodiment and measuring the field effect mobility. The field effect mobility M2 shows the results when making a MOSFET of the insulating film 501 included in the first reference example and measuring the field effect mobility. The field effect mobility M3 shows the results when making a MOSFET of the insulating film 502 included in the second reference example and measuring the field effect mobility.

In FIG. 4, the horizontal axis is the gate voltage (V); and the vertical axis is the field effect mobility ($cm^2/Vs$). As shown in FIG. 4, it can be seen that the field effect mobility M1 increases more than the field effect mobilities M2 and M3.

Thus, the interface state D1 in the case where the insulating film 50 is used is lower than the interface states D2 and D3 in the case where the insulating films 501 and 502 are used. Thereby, the field effect mobility improves more in the semiconductor device 110 according to the embodiment than in the semiconductor devices according to the first reference example and the second reference example.

In particular, it is desirable for the concentration of N at the position of the peak of the concentration distribution of N included in the insulating film 50 to be not less than $5 \times 10^{20}$ cm$^{-3}$ and not more than $1 \times 10^{22}$ cm$^{-3}$. It is desirable for the concentration of N on the first surface 20a side of the position of the peak of the concentration distribution of N included in the insulating film 50 to be not less than $5 \times 10^{19}$ cm$^{-3}$ but less than $5 \times 10^{21}$ cm$^{-3}$.

The inventors of the application further discovered that the concentration distribution of N is important in the region about 5 nm on the insulating film 50 side from the interface (the first surface 20a) between the insulating film 50 and the second semiconductor region 20. In other words, as illustrated by region R1 (the circle) in FIG. 2, it is desirable for the concentration of N to increase from the first surface 20a to at least about 5 nm on the insulating film 50 side.

The field effect mobility is affected by the defects and bonding state of the second semiconductor region 20 at the interface vicinity between the insulating film 50 and the second semiconductor region 20. Specifically, it is important for the concentration distribution of N to have an increasing trend in region R1 from the interface (the first surface 20a) to about 5 nm on the insulating film 50 side.

That is, even if the concentration distribution of N included in the insulating film 50 does not have a peak at not less than 2 nm but less than 10 nm from the first surface 20a, it is considered that effects similar to those of the case where there is a peak are obtained if the concentration of N increases to at least 5 nm from the first surface 20a.

Figure 5:
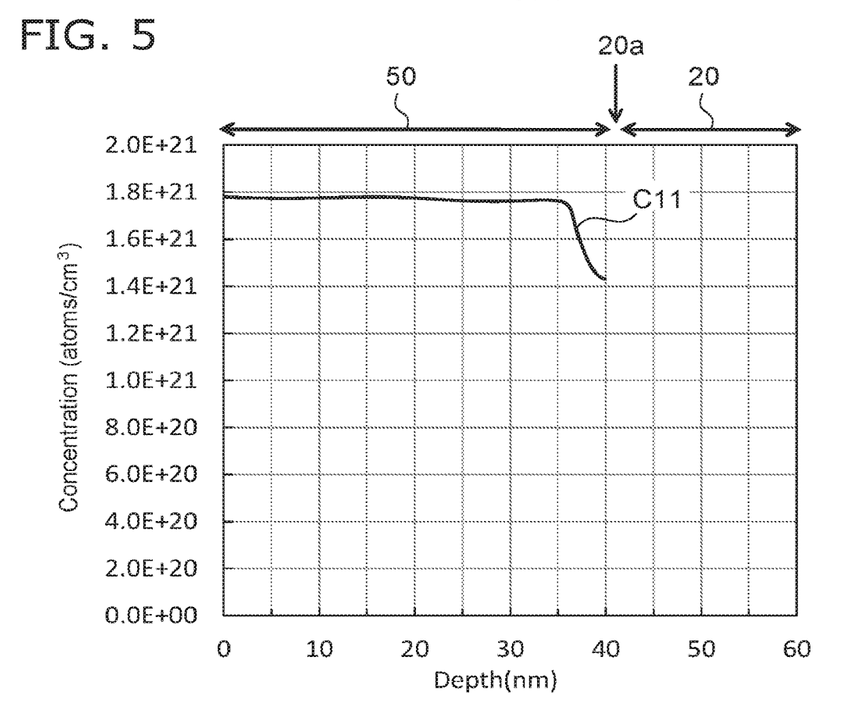
FIG. 5 shows another example of the concentration distribution of N in the insulating film.

FIG. 5 shows another example of the concentration distribution of N in the insulating film.

In FIG. 5, the horizontal axis is the depth (nm) having the surface of the insulating film 50 as a reference; and the vertical axis is the concentration (cm$^{-3}$) of N.

As shown in FIG. 5, a concentration distribution C11 increases gradually in the depth direction from the surface of the insulating film 50. The concentration distribution C11 has an increasing trend to at least 5 nm from the first surface 20a. No major peak exists in the concentration distribution C11. In other words, the concentration of N has an increasing trend to at least 5 nm from the first surface 20a, and does not have a decreasing trend further away from the first surface 20a. Even in the case where the insulating film 50 having such a concentration distribution C11 is used, it is considered that the field effect mobility is improved more than in the semiconductor devices according to the first reference example and the second reference example.

On the other hand, after the concentration of N included in the insulating film 50 increases to at least 5 nm from the first surface 20a, the concentration of N may have a peak at some position. In the case where the concentration distribution of N has a peak, it is desirable for the width at half maximum of the peak to be not less than 10 nm but less than 20 nm. Also, it is desirable for the concentration of N at the position of the peak to be not less than $5 \times 10^{20}$ cm$^{-3}$ and not more than $1 \times 10^{22}$ cm$^{-3}$. It is desirable for the concentration of N on the first surface 20a side of the position of the peak of the concentration distribution of N included in the insulating film 50 to be not less than $5 \times 10^{19}$ cm$^{-3}$ but less than $5 \times 10^{21}$ cm$^{-3}$. Thereby, the field effect mobility of the semiconductor device 110 is improved.

Second Embodiment

A method for manufacturing a semiconductor device according to a second embodiment will now be described.

Figure 6:
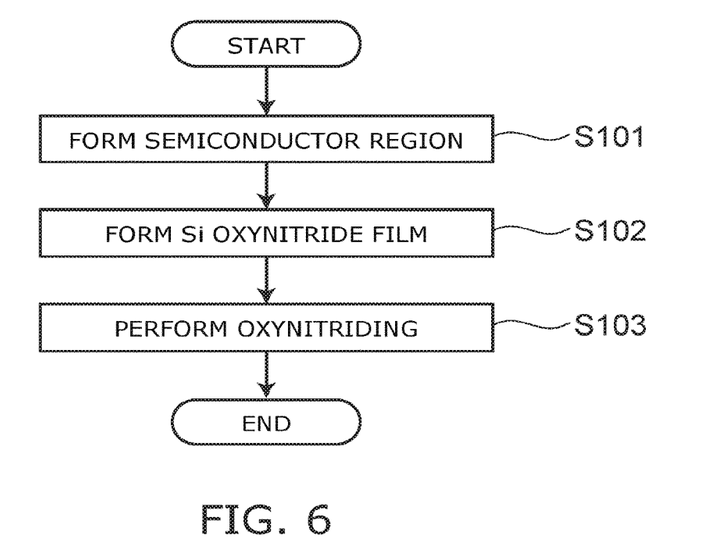
FIG. 6 is a flowchart illustrating a method for manufacturing the semiconductor device.

FIG. 6 is a flowchart illustrating the method for manufacturing the semiconductor device.

As shown in FIG. 6, the method for manufacturing the semiconductor device according to the embodiment includes forming a semiconductor region (step S101), forming a Si oxynitride film (step S102), and oxynitriding (step S103).

In the formation of the semiconductor region of step S101, processing is performed to form a semiconductor region including SiC and having a first surface. In the formation of the Si oxynitride film of step S102, processing is performed to form a Si oxynitride film contacting the first surface of the semiconductor region formed in step S101. In the oxynitriding of step S103, processing is performed to perform oxynitriding of the first surface of the Si oxynitride film formed in step S102. For example, the oxidizing may perform oxynitriding of the vicinity of the first surface.

By the oxynitriding of step S103, the position of the peak of the concentration distribution of N of the Si oxynitride film is set to be at a position not less than 2 nm but less than 10 nm away from the first surface.

By the oxynitriding of step S103, the width at half maximum of the peak of the concentration distribution of N of the Si oxynitride film may be set to be not less than 10 nm but less than 20 nm.

By the oxynitriding of step S103, the concentration of N at the position of the peak of the concentration distribution of N of the Si oxynitride film may be set to be not less than $5 \times 10^{20}$ cm$^{-3}$ and not more than $1 \times 10^{22}$ cm$^{-3}$.

By the oxynitriding of step S103, the concentration of N on the first surface side of the position of the peak of the Si oxynitride film may be set to be not less than $5 \times 10^{19}$ cm$^{-3}$ but less than $5 \times 10^{21}$ cm$^{-3}$.

By the oxynitriding of step S103, the concentration of N of the Si oxynitride film may be set to increase from the first surface to at least 5 nm.

A specific example of the method for manufacturing will now be described.

FIG. 7 to FIG. 10 are schematic cross-sectional views illustrating the method for manufacturing the semiconductor device.

Figure 7:
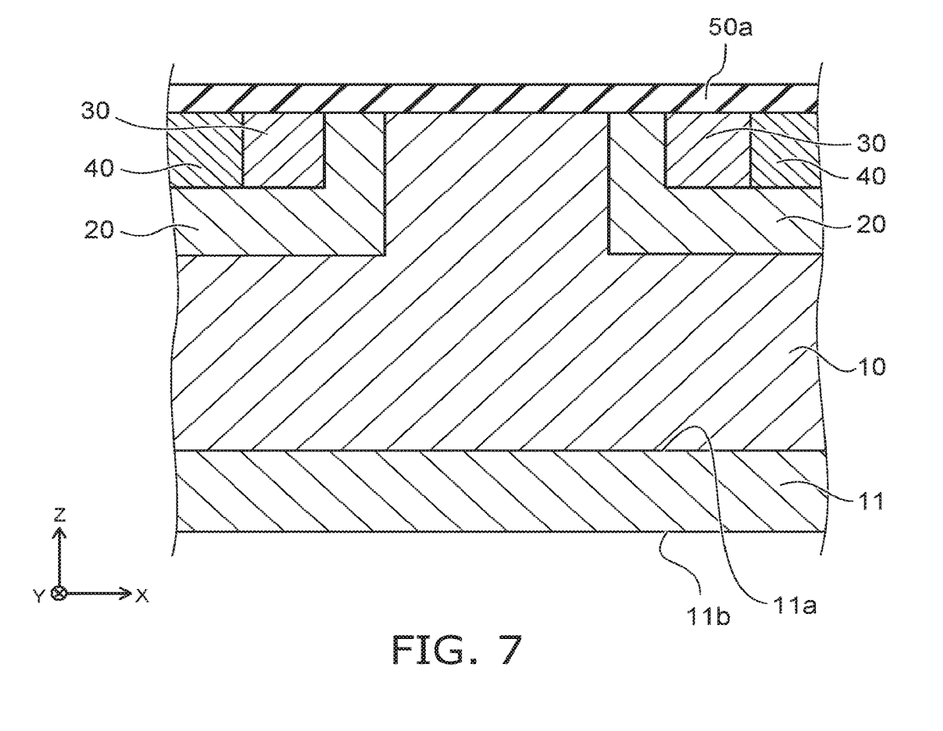
FIG. 7 is a schematic cross-sectional view illustrating the method for manufacturing the semiconductor device.

First, the substrate 11 is prepared as shown in FIG. 7. The substrate 11 includes 4H—SiC. The substrate 11 includes at least one of N or P as the n-type impurity. The impurity concentration of the substrate 11 is, for example, not less than about $5 \times 10^{18}$ cm$^{-3}$ and not more than about $1 \times 10^{19}$ cm$^{-3}$. The thickness of the substrate 11 is about 300 µm. The first major surface 11a of the substrate 11 is, for example, the (000-1) plane. The first major surface 11a may be the (0001) plane.

Then, the first semiconductor region 10 is formed on the first major surface 11a of the substrate 11. For example, the first semiconductor region 10 is formed on the first major surface 11a by epitaxial growth. For example, the first semiconductor region 10 includes N as the n-type impurity. The impurity concentration of the first semiconductor region 10 is, for example, not less than about $5 \times 10^{15}$ cm$^{-3}$ and not more than about $2 \times 10^{16}$ cm$^{-3}$. The thickness of the first semiconductor region 10 is, for example, about 10 µm.

Continuing, the second semiconductor region 20 is formed on the first semiconductor region 10. In other words, a not-shown mask material is formed on the first semiconductor region 10; and, for example, Al is ion-implanted as the p-type impurity through openings of the mask material.

Then, the third semiconductor region 30 is formed on the second semiconductor region 20. In other words, a not-shown mask material is formed on the second semiconductor region 20; and, for example, P which is the n-type impurity is ion-implanted through the openings of the mask material.

Continuing, the fourth semiconductor region 40 is formed as necessary in a region on the second semiconductor region 20 adjacent to the third semiconductor region 30. In other words, a not-shown mask material is formed on the second semiconductor region 20; and the p-type impurity, e.g., Al, is ion-implanted through the openings of the mask material.

For example, heat treatment is performed at a temperature of about 1700° C. after performing the ion implantation into the second semiconductor region 20, the third semiconductor region 30, and the fourth semiconductor region 40. Thereby, the impurities are activated.

Figure 8:
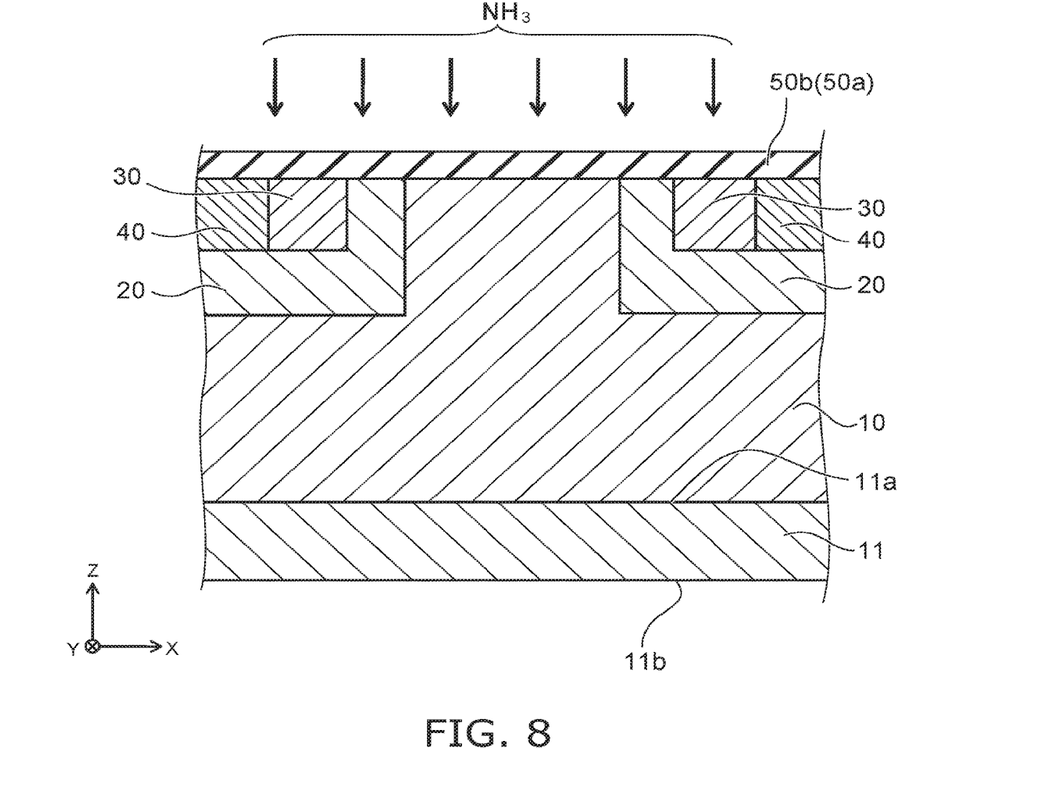
FIG. 8 is a schematic cross-sectional view illustrating the method for manufacturing the semiconductor device.

Then, a Si oxide film 50a is formed on the first semiconductor region 10, the second semiconductor region 20, the third semiconductor region 30, and the fourth semiconductor region 40. For example, the Si oxide film 50a is formed by at least one of wet oxidation, dry oxidation, chemical vapor deposition (CVD), or atomic layer deposition (ALD). The thickness of the Si oxide film 50a is, for example, about 50 nm. Continuing as shown in FIG. 8, for example, heat treatment is performed at 1200° C. in an atmosphere including ammonia ($NH_3$). Thereby, a Si oxynitride film 50b is formed by adding N to the Si oxide film 50a. The concentration of N of the Si oxynitride film 50b is, for example, about $5 \times 10^{21}$ $cm^{-3}$.

The Si oxynitride film 50b may be directly formed on the first semiconductor region 10, the second semiconductor region 20, the third semiconductor region 30, and the fourth semiconductor region 40 by CVD or ALD. In other words, the Si oxynitride film 50b may be formed by heat treatment in an atmosphere including $NH_3$ after forming the Si oxide film 50a; or the Si oxynitride film 50b may be formed without forming the Si oxide film 50a.

Figure 9:
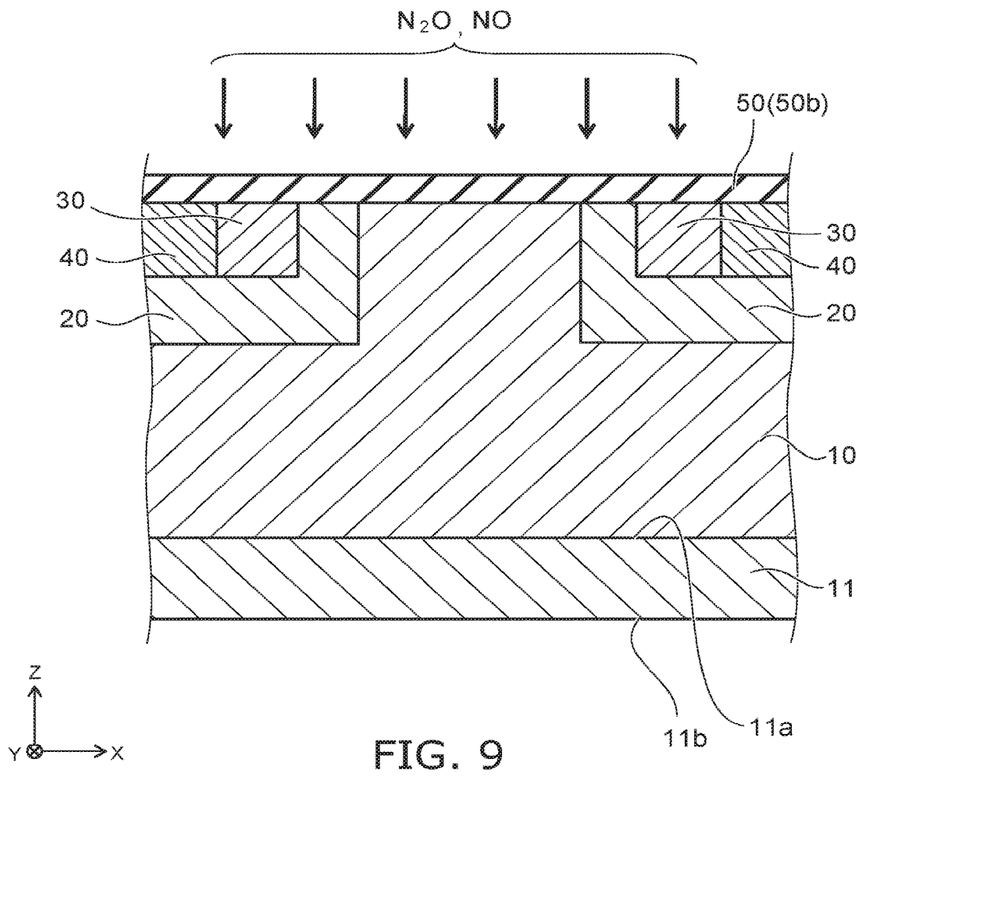
FIG. 9 is a schematic cross-sectional view illustrating the method for manufacturing the semiconductor device.

Then, as shown in FIG. 9, heat treatment (oxynitriding) of the Si oxynitride film 50b is performed at, for example, 1200° C. in an atmosphere including, for example, at least one of nitrous oxide ($N_2O$) or nitric oxide (NO). Thereby, the insulating film 50 is formed in which oxynitriding of the interface between the Si oxynitride film 50b and the second semiconductor region 20 is performed. In other words, by the oxynitriding, the position of the peak of the concentration distribution of N of the Si oxynitride film 50b is set to be at a position that is not less than 2 nm but less than 10 nm away from the first surface 20a.

By the oxynitriding, the width at half maximum of the peak of the concentration distribution of N of the Si oxynitride film 50b may be set to be not less than 10 nm but less than 20 nm. By the oxynitriding, the concentration of N at the position of the peak of the concentration distribution of N of the Si oxynitride film may be set to be not less than $5 \times 10^{20}$ $cm^{-3}$ and not more than $1 \times 10^{22}$ $cm^{-3}$. By the oxynitriding, the concentration of N on the first surface side of the position of the peak of the Si oxynitride film may be set to be not less than $5 \times 10^{19}$ $cm^{-3}$ but less than $5 \times 10^{21}$ $cm^{-3}$. By the oxynitriding, the concentration of N of the Si oxynitride films may be set to increase from the first surface to at least 5 nm.

Figure 10:
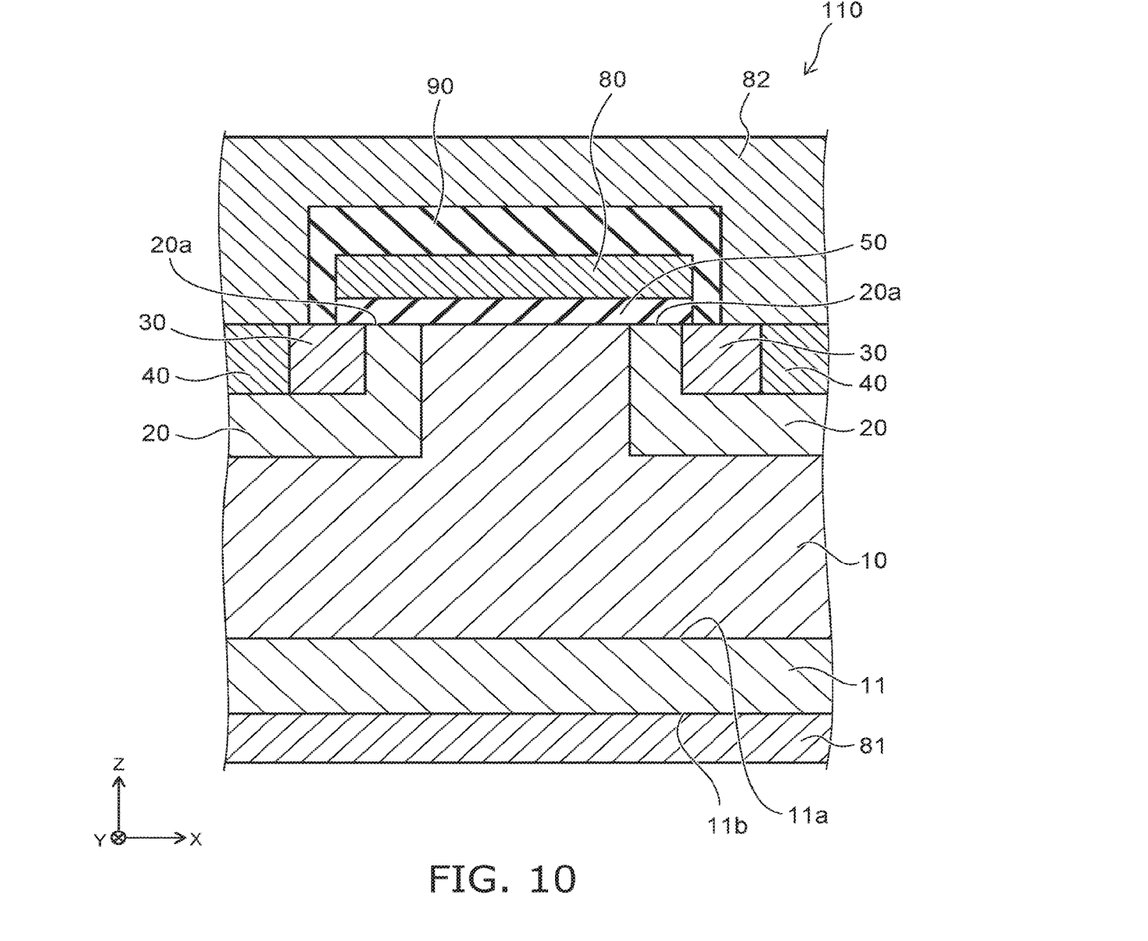
FIG. 10 is a schematic cross-sectional view illustrating the method for manufacturing the semiconductor device.

Then, as shown in FIG. 10, for example, polysilicon is deposited on the insulating film 50; and the polysilicon is patterned using a not-shown mask material. Thereby, the control electrode 80 is formed. Subsequently, the inter-layer insulating film 90 that covers the control electrode 80 is formed; and the second electrode 82 is formed on the inter-layer insulating film 90. Also, the first electrode 81 is formed on the second major surface 11b of the substrate 11. Thereby, the semiconductor device 110 is completed.

The concentration distribution C1 shown in FIG. 2, the interface state D1 shown in FIG. 3, and the field effect mobility M1 shown in FIG. 4 illustrate the characteristics of the semiconductor device 110 including the insulating film 50 such as that recited above. The insulating film 50 is a film formed by performing the oxynitriding using $N_2O$, etc., shown in FIG. 9 after the Si oxynitride film 50b shown in FIG. 8 is formed. By performing the oxynitriding using $N_2O$, etc., after forming the Si oxynitride film 50b, the concentration distribution of N of the Si oxynitride film 50b is adjusted. Thereby, the insulating film 50 is formed.

Here, the concentration distribution C2 shown in FIG. 2, the interface state D2 shown in FIG. 3, and the field effect mobility M2 shown in FIG. 4 illustrate the characteristics of the semiconductor device according to the first reference example including the insulating film 501. The insulating film 501 is a film formed by performing the oxynitriding using $N_2O$, etc., shown in FIG. 9 after the Si oxide film 50a shown in FIG. 7 is formed. In other words, the insulating film 501 is a film formed without performing the heat treatment using $NH_3$ shown in FIG. 8.

The concentration distribution C3 shown in FIG. 2, the interface state D3 shown in FIG. 3, and the field effect mobility M3 shown in FIG. 4 illustrate the characteristics of the semiconductor device according to the second reference example including the insulating film 502. The insulating film 502 is a film formed by performing the heat treatment using $NH_3$ shown in FIG. 8 after the Si oxide film 50a shown in FIG. 7 is formed. In other words, the insulating film 502 is a film formed without performing the oxynitriding using $N_2O$, etc., shown in FIG. 9.

As in the manufacturing method according to the embodiment, by performing the oxynitriding using $N_2O$, etc., after forming the Si oxynitride film 50b, the position of the peak of the concentration distribution of N of the insulating film 50 is set to be not less than 2 nm but less than 10 nm away from the interface (the first surface 20a) between the insulating film 50 and the second semiconductor region 20. Thereby, the excessive N at the vicinity of the first surface 20a of the insulating film 50 is removed; and an interface having a good bonding state having few defects is formed. Thereby, the field effect mobility of the semiconductor device 110 is higher than the field effect mobility of the semiconductor devices according to the first reference example and the second reference example.

Third Embodiment

A semiconductor device according to a third embodiment will now be described.

Figure 11:
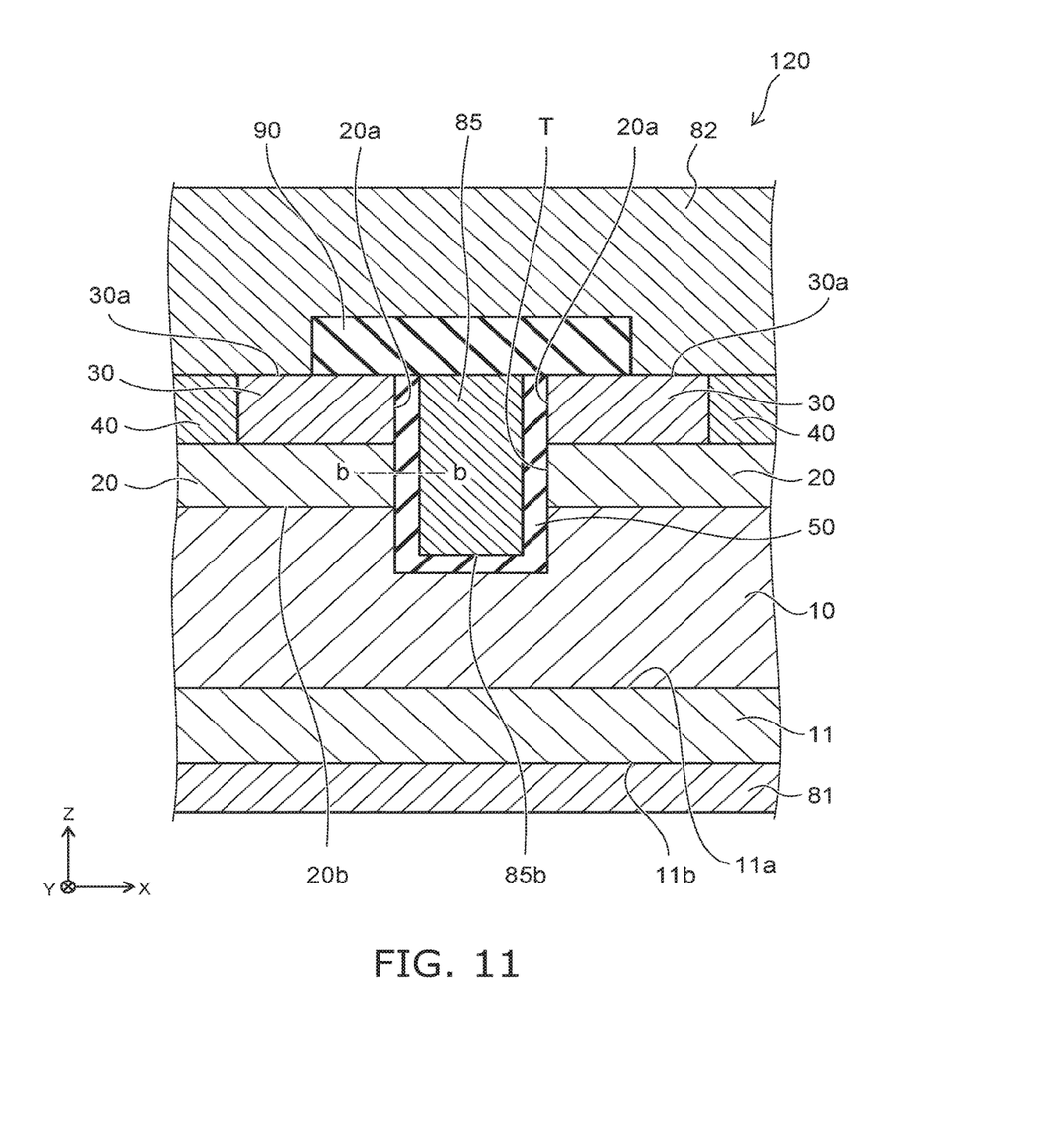
FIG. 11 is a schematic cross-sectional view illustrating the configuration of a semiconductor device according to a third embodiment.

FIG. 11 is a schematic cross-sectional view illustrating the configuration of the semiconductor device according to the third embodiment.

In the semiconductor device 120 shown in FIG. 11, the structure of a control electrode 85 differs from the structure of the control electrode 80 of the semiconductor device 110 shown in FIG. 1. Otherwise, the configuration is similar to that of the semiconductor device 110.

The structure of the control electrode 85 of the semiconductor device 120 is a trench gate structure. The control electrode 85 extends in the Z-direction. The position of one end 85a of the control electrode 85 is substantially the same as the position of one end 30a of the third semiconductor region 30. The position of one other end 85b of the control electrode 85 is on the substrate 11 side of the boundary between the second semiconductor region 20 and the first semiconductor region 10. In the semiconductor device 120, the first surface 20a of the second semiconductor region 20 is a plane (e.g., the (11-20) plane) that is orthogonal to the (000-1) plane or the (0001) plane of 4H—SiC.

The insulating film 50 is provided between the control electrode 85 and the first surface 20a of the second semiconductor region 20. The position of the peak of the concentration distribution of N included in the insulating film 50 (the concentration distribution along line b-b parallel to the X-direction shown in FIG. 11) is not less than 2 nm but less than 10 nm away from the first surface 20a in the X-direction. Further, the width at half maximum of the peak of the concentration distribution of N included in the insulating film 50 is not less than 10 nm but less than 20 nm. The concentration of N included in the insulating film 50 is similar to that of the semiconductor device 110.

In the semiconductor device 120, the thickness of the insulating film 50 is the thickness in the X-direction. In the semiconductor device 120, the depth (the depth in the Z-direction from the one end 30a of the third semiconductor region 30) of the second semiconductor region 20 is, for example, about 1 μm.

The insulating film 50 is formed along the inner wall of a trench T made partway through the first semiconductor region 10 in the Z-direction from the position of the one end 30a of the third semiconductor region 30. The control electrode 85 is filled into the trench T with the insulating film 50 interposed.

In the semiconductor device 120 having such a trench gate structure as well, the field effect mobility improves similarly to the semiconductor device 110. The semiconductor device 120 having the trench gate structure is advantageous compared to the semiconductor device 110 having the planar structure in which the channel has higher density. The JFET resistance that occurs in the first semiconductor region 10 existing between the second semiconductor region 20 in the planar structure does not exist in the trench-gate type. Therefore, the semiconductor device 120 is advantageous by having a lower ON resistance. In the semiconductor device 120 having the trench gate structure, in the case where the (0001) plane or the (000-1) plane is used as the substrate 11, for example, the channel is formed in the (11-20) plane. Accordingly, there are expectations for an even higher field effect mobility compared to the case where the channel is formed in the (0001) plane or the (000-1) plane.

As described above, according to the semiconductor device and the method for manufacturing the semiconductor device according to the embodiment, the field effect mobility can be improved.

Although the embodiments are described above, the invention is not limited to these examples. For example, additions, deletions, or design modifications of components or appropriate combinations of the features of the embodiments appropriately made by one skilled in the art in regard to the embodiments described above are within the scope of the invention to the extent that the purport of the invention is included.

Although the first conductivity type is described as the n-type and the second conductivity type is described as the p-type in the embodiments described above, for example, the invention is practicable also when the first conductivity type is the p-type and the second conductivity type is the n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor region of a first conductivity type including SiC;
   a second semiconductor region of a second conductivity type provided on the first semiconductor region, the second semiconductor region including SiC and having a first surface;
   a third semiconductor region of the first conductivity type provided on the second semiconductor region, the third semiconductor region including SiC;
   a first electrode electrically connected to the first semiconductor region;
   a second electrode electrically connected to the third semiconductor region;
   a control electrode provided on the second semiconductor region; and
   an insulating film provided between the second semiconductor region and the control electrode, the insulating film contacting the first surface and the control electrode and including nitrogen, the insulating film including a first position and a second position along a first direction, the first direction being from the second semiconductor region toward the control electrode, the first position being disposed between the second position and the first surface in the first direction, a concentration of the nitrogen in the insulating film having a peak at the first position, a distance between the first position and the first surface being not less than 2 nanometers but less than 10 nanometers, a concentration of the nitrogen at the second position being ½ of the concentration of the nitrogen at the first position, a distance along the first direction between the first position and the second position being not less than 5 nanometers but less than 10 nanometers.

2. The device according to claim 1, wherein the concentration of the nitrogen at the first position is not less than $5 \times 10^{20}$ cm$^{-3}$ and not more than $1 \times 10^{22}$ cm$^{-3}$.

3. The device according to claim 1, wherein
   the insulating film includes a region between the first position and the first surface, and
   a concentration of the nitrogen in the region is not less than $5 \times 10^{19}$ cm$^{-3}$ but less than $5 \times 10^{21}$ cm$^{-3}$.

4. The device according to claim 1, wherein the first surface is at least one of the (0001) plane of SiC, the (000-1) plane of SiC, or the (11-20) plane of SiC.

5. A method for manufacturing the semiconductor device of claim 1, comprising:
   forming a semiconductor region including SiC and having a first surface;
   forming a Si oxynitride film contacting the first surface of the semiconductor region; and
   oxynitriding the first surface of the Si oxynitride film.

6. The method according to claim 5, wherein
   the forming of the Si oxynitride film includes:
   forming a Si oxide film; and
   performing a first heat treatment of the Si oxide film in an atmosphere including $NH_3$.

7. The method according to claim 6, wherein the forming of the Si oxide film includes forming the Si oxide film by at least one of wet oxidation, dry oxidation, chemical vapor deposition, or atomic layer deposition.

8. The method according to claim 6, wherein the first heat treatment includes performing heat treatment at a temperature of not less than 1150° C. and not more than 1350° C. for a time of not less than 10 minutes and not more than 120 minutes.

9. The method according to claim 5, wherein the oxynitriding of the first surface includes performing a second heat treatment of the Si oxynitride film in an atmosphere including at least one of $N_2O$ and NO.

10. The method according to claim 9, wherein the second heat treatment includes performing heat treatment at a temperature of not less than 1150° C. and not more than 1350° C. for a time of not less than 10 minutes and not more than 120 minutes.

* * * * *